(12) United States Patent
Jung

(10) Patent No.: US 8,939,790 B2
(45) Date of Patent: Jan. 27, 2015

(54) SIGNAL CABLE, CABLE CONNECTOR AND SIGNAL CABLE CONNECTING APPARATUS INCLUDING THE SAME

(71) Applicant: Samsung Electronics Co., Ltd., Suwon-si (KR)

(72) Inventor: Jae-woong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 13/753,734

(22) Filed: Jan. 30, 2013

(65) Prior Publication Data

US 2013/0196529 A1 Aug. 1, 2013

(30) Foreign Application Priority Data

Jan. 30, 2012 (KR) ........................ 10-2012-0008859

(51) Int. Cl.
| | | |
|---|---|---|
| *H01R 12/24* | (2006.01) | |
| *H01R 13/62* | (2006.01) | |
| *H01R 12/77* | (2011.01) | |
| *H05K 1/11* | (2006.01) | |

(52) U.S. Cl.
CPC .............. *H01R 13/62* (2013.01); *H01R 12/774* (2013.01); *H05K 2201/2009* (2013.01); *H05K 1/118* (2013.01)
USPC .......................................... 439/495; 439/483

(58) Field of Classification Search
USPC ......... 439/260, 267, 492, 493, 495, 496, 497, 439/499, 329
See application file for complete search history.

(56) References Cited

U.S. PATENT DOCUMENTS

| | | | | |
|---|---|---|---|---|
| 4,310,208 | A | * | 1/1982 | Webster et al. ................ 439/494 |
| 5,201,671 | A | * | 4/1993 | Elias .............................. 439/483 |
| 5,924,891 | A | * | 7/1999 | Benjamin et al. ............. 439/495 |
| 6,089,905 | A | * | 7/2000 | Shimmyo et al. ............. 439/495 |
| 6,162,083 | A | * | 12/2000 | Seto ............................... 439/328 |
| 6,315,616 | B1 | * | 11/2001 | Hayashi ........................ 439/638 |
| 6,319,049 | B1 | * | 11/2001 | Lee ................................ 439/484 |
| 6,364,695 | B1 | * | 4/2002 | Watanabe ..................... 439/498 |
| 6,373,278 | B1 | | 4/2002 | Sung et al. |
| 6,558,186 | B1 | * | 5/2003 | LePottier et al. ............. 439/496 |
| 6,592,380 | B2 | * | 7/2003 | Miyazawa et al. ............. 439/67 |
| 6,595,796 | B1 | * | 7/2003 | Koegel et al. ................ 439/495 |

(Continued)

FOREIGN PATENT DOCUMENTS

| | | |
|---|---|---|
| EP | 2075877 A2 | 7/2009 |
| JP | 2003187901 A | 7/2003 |
| JP | 3143692 U | 7/2008 |
| KR | 100972299 B1 | 7/2010 |
| KR | 1020100124065 A | 11/2010 |
| WO | 2011121446 A1 | 10/2011 |

OTHER PUBLICATIONS

International Search Report, dated May 31, 2013, issued by the International Searching Authority in counterpart International Application No. PCT/KR2013/000767.

(Continued)

*Primary Examiner* — Ross Gushi
(74) *Attorney, Agent, or Firm* — Sughrue Mion, PLLC

(57) ABSTRACT

A signal cable, a cable connector, and a signal cable connecting apparatus including the same facilitate connection of the signal cable to the cable connector. The signal cable includes a plurality of signal lines; a cable film which sheaths the plurality of signal lines; and a cable locking portion formed in the cable film, to releasably engage with a cable holder of a cable connector.

17 Claims, 7 Drawing Sheets

(56) References Cited

U.S. PATENT DOCUMENTS

| | | | | |
|---|---|---|---|---|
| 6,659,794 | B2* | 12/2003 | Yamatani et al. | 439/495 |
| 6,669,503 | B2* | 12/2003 | Hirose | 439/495 |
| 6,676,444 | B2* | 1/2004 | Noro | 439/579 |
| 6,685,499 | B2* | 2/2004 | Takahashi et al. | 439/483 |
| 6,726,504 | B2* | 4/2004 | Fuerst et al. | 439/496 |
| 6,739,903 | B1* | 5/2004 | Aoki et al. | 439/496 |
| 6,749,458 | B1* | 6/2004 | Kuo et al. | 439/484 |
| 6,755,683 | B2* | 6/2004 | Roberts et al. | 439/496 |
| 6,773,287 | B2* | 8/2004 | Takashita | 439/260 |
| 6,830,478 | B1* | 12/2004 | Ko | 439/579 |
| 6,893,287 | B2* | 5/2005 | Kuo et al. | 439/484 |
| 6,908,332 | B2* | 6/2005 | Takahashi et al. | 439/483 |
| 7,083,455 | B1* | 8/2006 | Miura et al. | 439/260 |
| 7,094,093 | B2* | 8/2006 | Nakano et al. | 439/495 |
| 7,134,891 | B2* | 11/2006 | Kayama et al. | 439/260 |
| 7,140,909 | B2* | 11/2006 | Moritake | 439/492 |
| 7,175,472 | B2* | 2/2007 | Wu et al. | 439/492 |
| 7,255,584 | B2* | 8/2007 | Takashita | 439/260 |
| 7,374,429 | B2* | 5/2008 | Cronch et al. | 439/67 |
| 7,422,472 | B2* | 9/2008 | Hashiguchi et al. | 439/495 |
| 7,435,129 | B2* | 10/2008 | Su et al. | 439/483 |
| 7,438,590 | B1 | 10/2008 | Liang et al. | |
| 7,445,494 | B2* | 11/2008 | Wei et al. | 439/495 |
| 7,473,125 | B2* | 1/2009 | Murakami | 439/495 |
| 7,507,112 | B2* | 3/2009 | Mundt | 439/495 |
| 7,510,424 | B2* | 3/2009 | Mundt | 439/492 |
| 7,534,131 | B2* | 5/2009 | Chung | 439/495 |
| 7,540,764 | B2* | 6/2009 | Suzuki et al. | 439/495 |
| 7,544,087 | B2* | 6/2009 | Homer et al. | 439/492 |
| 7,628,618 | B2* | 12/2009 | Wang et al. | 439/67 |
| 7,661,972 | B2* | 2/2010 | Okamura et al. | 439/260 |
| 7,713,080 | B1* | 5/2010 | Wahlberg | 439/329 |
| 7,722,373 | B2* | 5/2010 | Nemoto | 439/260 |
| 7,766,680 | B2* | 8/2010 | Suzuki et al. | 439/260 |
| 7,833,046 | B2* | 11/2010 | Tamura et al. | 439/422 |
| 7,850,473 | B1* | 12/2010 | Ozeki | 439/260 |
| 7,854,625 | B1* | 12/2010 | Yuan et al. | 439/495 |
| 7,862,361 | B2* | 1/2011 | Wahlberg | 439/329 |
| 7,862,370 | B1* | 1/2011 | Chen | 439/495 |
| 7,887,351 | B2* | 2/2011 | Wang et al. | 439/260 |
| 7,944,252 | B1 | 5/2011 | Bhakta et al. | |
| 7,976,328 | B2* | 7/2011 | Tsai et al. | 439/341 |
| 8,002,567 | B2* | 8/2011 | Hara | 439/329 |
| 8,029,314 | B2* | 10/2011 | Huang | 439/492 |
| 8,075,328 | B2* | 12/2011 | Ashibu | 439/260 |
| 8,083,541 | B2* | 12/2011 | Yeh | 439/492 |
| 8,083,542 | B2* | 12/2011 | Kodaira | 439/497 |
| 8,123,550 | B2* | 2/2012 | Hoshino et al. | 439/495 |
| 8,128,425 | B2* | 3/2012 | Takahashi et al. | 439/260 |
| 8,128,429 | B2* | 3/2012 | Suzuki | 439/493 |
| 8,133,067 | B2* | 3/2012 | Tsai et al. | 439/260 |
| 8,192,219 | B2* | 6/2012 | Satoh | 439/328 |
| 8,202,108 | B2* | 6/2012 | Shen | 439/329 |
| 8,202,111 | B2* | 6/2012 | Kojima | 439/492 |
| 8,241,057 | B2* | 8/2012 | Lee | 439/495 |
| 8,241,065 | B2* | 8/2012 | Ikari et al. | 439/607.41 |
| 8,267,717 | B2* | 9/2012 | Ishishita et al. | 439/495 |
| 8,292,648 | B2* | 10/2012 | Kiryu et al. | 439/328 |
| 8,298,001 | B2* | 10/2012 | Ashibu et al. | 439/495 |
| 8,313,342 | B2* | 11/2012 | Lin et al. | 439/492 |
| 8,337,230 | B1* | 12/2012 | Kurachi | 439/328 |
| 8,376,762 | B2* | 2/2013 | Ozeki | 439/153 |
| 8,398,417 | B2* | 3/2013 | Ozeki | 439/260 |
| 8,444,427 | B2* | 5/2013 | Hashimoto | 439/325 |
| 8,465,324 | B2* | 6/2013 | Ikari et al. | 439/607.31 |
| 8,512,058 | B2* | 8/2013 | Ozeki | 439/260 |
| 8,529,286 | B2* | 9/2013 | Su et al. | 439/495 |
| 8,556,652 | B2* | 10/2013 | Kang et al. | 439/498 |
| 8,579,654 | B2* | 11/2013 | Chen et al. | 439/495 |
| 8,608,509 | B2* | 12/2013 | Shimada et al. | 439/607.01 |
| 8,616,906 | B2* | 12/2013 | Iijima et al. | 439/260 |
| 8,622,767 | B2* | 1/2014 | Nakazura et al. | 439/499 |
| 8,651,885 | B2* | 2/2014 | Ashibu | 439/328 |
| 8,651,888 | B2* | 2/2014 | Kurachi | 439/358 |
| 8,662,916 | B2* | 3/2014 | Ashibu | 439/495 |
| 8,678,844 | B2* | 3/2014 | Yoshisuji et al. | 439/350 |
| 2002/0142647 | A1* | 10/2002 | Aoki | 439/496 |
| 2002/0146932 | A1* | 10/2002 | Yamatani et al. | 439/495 |
| 2003/0073345 | A1* | 4/2003 | LePottier et al. | 439/496 |
| 2003/0211773 | A1* | 11/2003 | Ishii | 439/495 |
| 2004/0002255 | A1* | 1/2004 | Ueda et al. | 439/495 |
| 2004/0102083 | A1* | 5/2004 | Kuroda et al. | 439/495 |
| 2004/0110412 | A1* | 6/2004 | Ueda | 439/495 |
| 2004/0203274 | A1* | 10/2004 | Peng | 439/329 |
| 2004/0248460 | A1* | 12/2004 | Masaki et al. | 439/492 |
| 2005/0026494 | A1* | 2/2005 | Kudo et al. | 439/495 |
| 2005/0075004 | A1* | 4/2005 | Endou et al. | 439/495 |
| 2005/0118860 | A1* | 6/2005 | Kunishi | 439/495 |
| 2005/0170685 | A1* | 8/2005 | Satou | 439/495 |
| 2005/0208824 | A1* | 9/2005 | Kayama et al. | 439/495 |
| 2005/0215109 | A1* | 9/2005 | Satou | 439/492 |
| 2005/0233632 | A1* | 10/2005 | Hsu et al. | 439/495 |
| 2005/0255742 | A1* | 11/2005 | Shih | 439/492 |
| 2006/0035516 | A1* | 2/2006 | Wu et al. | 439/492 |
| 2006/0089036 | A1* | 4/2006 | Takai et al. | 439/260 |
| 2006/0105622 | A1* | 5/2006 | Nakano et al. | 439/495 |
| 2006/0116005 | A1 | 6/2006 | Yu et al. | |
| 2006/0134969 | A1* | 6/2006 | Takaku et al. | 439/495 |
| 2006/0148308 | A1* | 7/2006 | Pabst et al. | 439/495 |
| 2006/0160390 | A1* | 7/2006 | Miura et al. | 439/260 |
| 2006/0292911 | A1* | 12/2006 | Ning | 439/260 |
| 2007/0077809 | A1* | 4/2007 | Takashita | 439/492 |
| 2007/0093122 | A1* | 4/2007 | Kudo et al. | 439/495 |
| 2007/0254523 | A1* | 11/2007 | Homer et al. | 439/492 |
| 2008/0050958 | A1* | 2/2008 | Hashiguchi et al. | 439/312 |
| 2008/0050966 | A1* | 2/2008 | Hashiguchi et al. | 439/495 |
| 2008/0146075 | A1* | 6/2008 | Mundt | 439/492 |
| 2009/0004910 | A1* | 1/2009 | Takahira | 439/495 |
| 2009/0023324 | A1* | 1/2009 | Koike et al. | 439/345 |
| 2009/0088012 | A1* | 4/2009 | Oooka | 439/260 |
| 2009/0137146 | A1* | 5/2009 | Wang et al. | 439/499 |
| 2009/0137147 | A1* | 5/2009 | Yang et al. | 439/499 |
| 2009/0163067 | A1* | 6/2009 | Niitsu | 439/329 |
| 2009/0176403 | A1* | 7/2009 | Yang et al. | 439/495 |
| 2009/0221178 | A1* | 9/2009 | Hirata et al. | 439/497 |
| 2010/0087087 | A1* | 4/2010 | Yeh | 439/493 |
| 2010/0105230 | A1* | 4/2010 | Davidsson | 439/260 |
| 2010/0130045 | A1* | 5/2010 | Higuchi | 439/260 |
| 2010/0136815 | A1* | 6/2010 | Wahlberg | 439/329 |
| 2010/0190373 | A1* | 7/2010 | Yeh | 439/499 |
| 2010/0227491 | A1* | 9/2010 | Tsai et al. | 439/260 |
| 2010/0261375 | A1* | 10/2010 | Wang et al. | 439/492 |
| 2010/0273341 | A1* | 10/2010 | Shen | 439/329 |
| 2010/0291790 | A1* | 11/2010 | Kiryu et al. | 439/374 |
| 2011/0104938 | A1* | 5/2011 | Suzuki | 439/493 |
| 2011/0111615 | A1* | 5/2011 | Tsai et al. | 439/329 |
| 2011/0117765 | A1* | 5/2011 | Takahashi et al. | 439/329 |
| 2011/0136365 | A1* | 6/2011 | Hara | 439/329 |
| 2011/0223790 | A1* | 9/2011 | Hoshino et al. | 439/329 |
| 2011/0244709 | A1* | 10/2011 | Ashibu | 439/372 |
| 2011/0275238 | A1* | 11/2011 | Iijima et al. | 439/492 |
| 2011/0294340 | A1* | 12/2011 | Kojima | 439/497 |
| 2011/0312213 | A1* | 12/2011 | Arai | 439/492 |
| 2012/0064749 | A1* | 3/2012 | Hashimoto | 439/329 |
| 2012/0100736 | A1* | 4/2012 | Ashibu et al. | 439/260 |
| 2012/0142218 | A1* | 6/2012 | Lin et al. | 439/607.49 |
| 2012/0149235 | A1* | 6/2012 | Su et al. | 439/492 |
| 2012/0208385 | A1* | 8/2012 | Ozeki | 439/153 |
| 2012/0220171 | A1* | 8/2012 | Shimada et al. | 439/660 |
| 2012/0231646 | A1* | 9/2012 | Nakano | 439/267 |
| 2012/0238125 | A1* | 9/2012 | Yoshisuji et al. | 439/350 |
| 2012/0258618 | A1* | 10/2012 | Sasaki et al. | 439/260 |
| 2013/0052861 | A1* | 2/2013 | Niitsu et al. | 439/492 |
| 2013/0196529 | A1* | 8/2013 | Jung | 439/345 |
| 2013/0309887 | A1* | 11/2013 | Honda | 439/260 |

OTHER PUBLICATIONS

Communication, dated Apr. 19, 2013, issued by the European Patent Office in counterpart European Application No. 13153145.1.

* cited by examiner

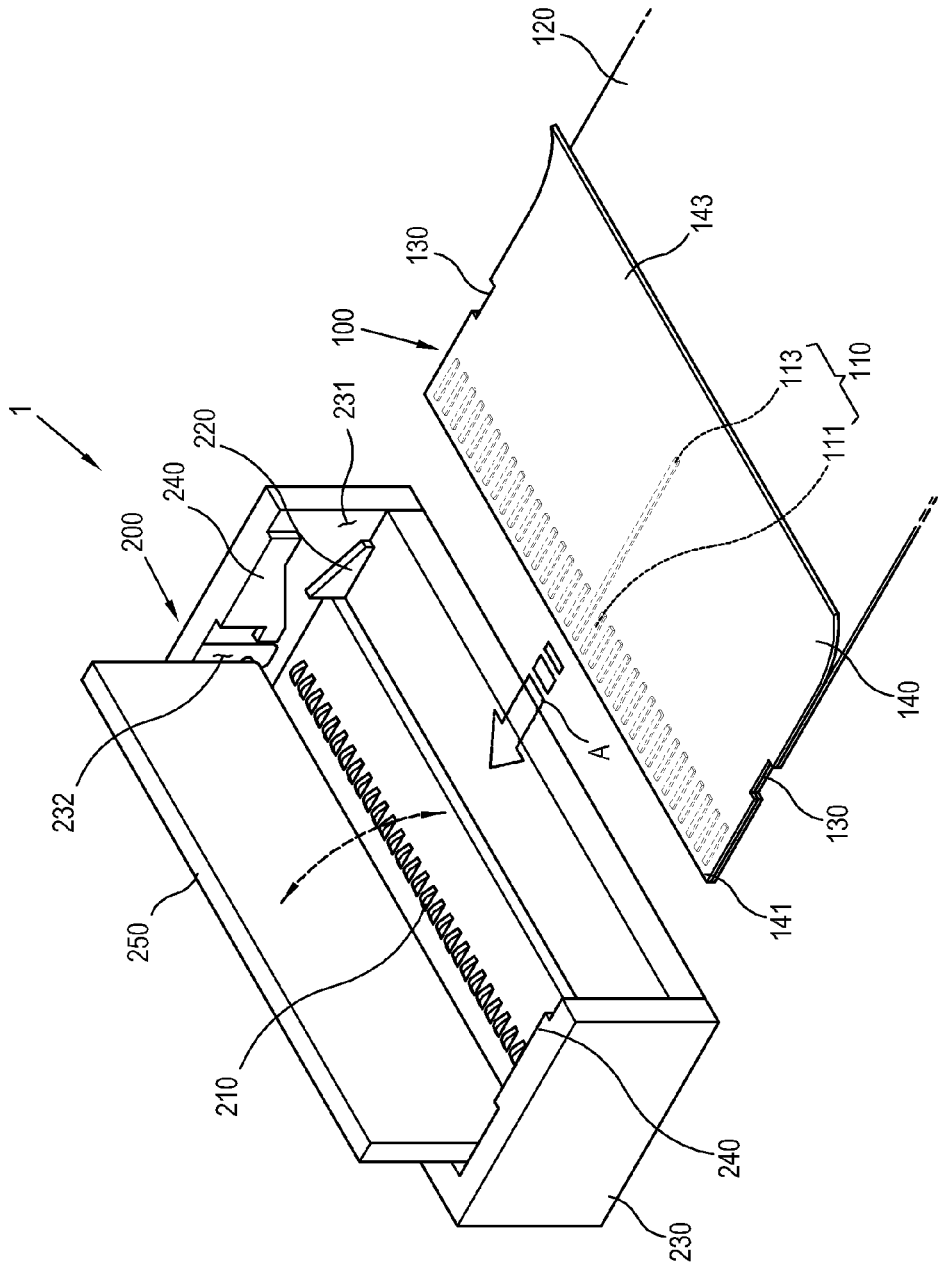

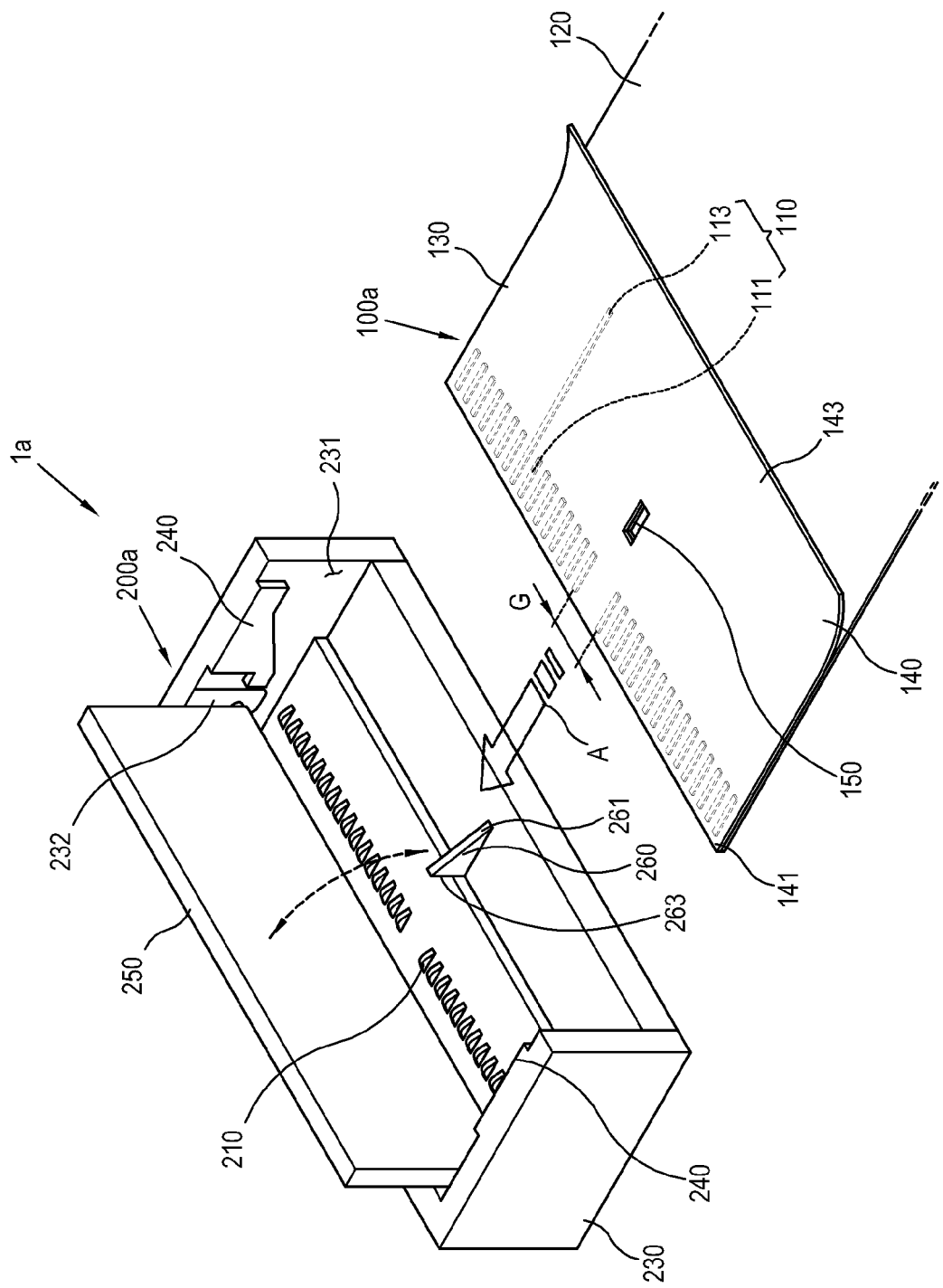

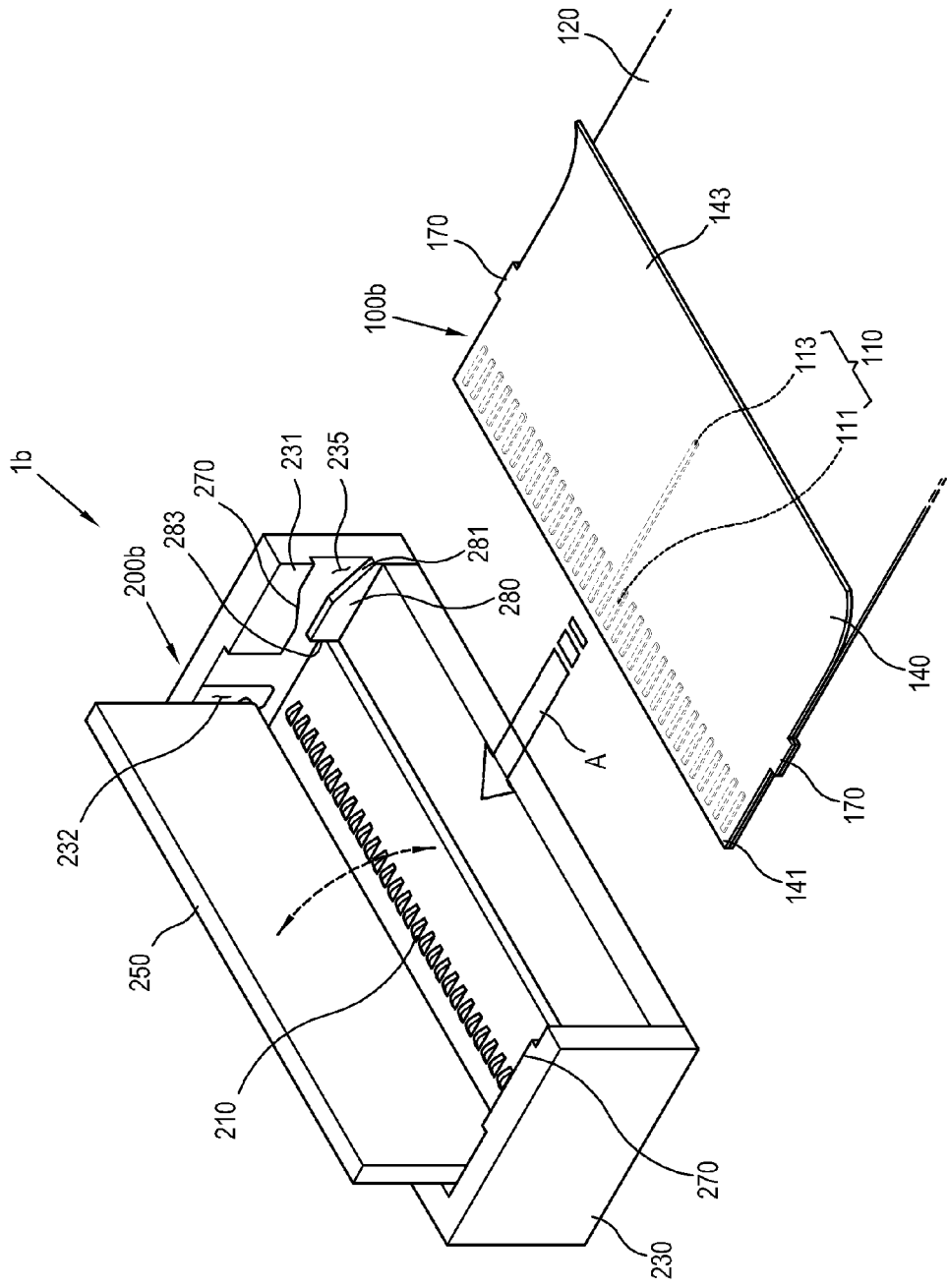

SIGNAL CABLE, CABLE CONNECTOR AND SIGNAL CABLE CONNECTING APPARATUS INCLUDING THE SAME

CROSS-REFERENCE TO RELATED APPLICATION

This application claims priority from Korean Patent Application No. 10-2012-0008859, filed on Jan. 30, 2012, in the Korean Intellectual Property Office, the disclosure of which is incorporated herein by reference.

BACKGROUND OF THE INVENTION

1. Field of the Invention

Apparatuses consistent with the exemplary embodiments relate to a signal cable, a cable connector, and a signal cable connecting apparatus including the same, and more particularly to a signal cable, a cable connector, and a signal cable connecting apparatus including the same, in which the signal cable can be easily connected to the cable connector.

2. Discussion of the Related Art

Television receivers, set-top boxes, monitors, smart phones, smart pads, notebook computers, and various like electronic apparatuses are internally provided with signal cables for transmitting data (electrical signals) between elements of the apparatuses. At least one end of the signal cable is typically connected to a separate cable connector, which is provided to connect the signal cable to an internal element (e.g., a circuit board) of an electronic apparatus, thus enabling signal transmission from one end of the signal cable to the other end and from the signal cable to the internal element. At the same time, a corresponding end of the signal cable is provided with a connector component for connecting the signal cable to the separate cable connector.

The connector component, however, is bulky, and its use hinders the design of a slim electronic apparatus. Moreover, there are production costs associated with providing the connector component to one or both ends of a signal cable. On the other hand, without the use of a connector component, the corresponding end of the signal cable may easily become disconnected from the separate cable connector.

SUMMARY OF THE INVENTION

Aspects of one or more exemplary embodiments may be achieved by providing a signal cable including a plurality of signal lines; a cable film which sheaths the plurality of signal lines; and a cable locking portion formed in the cable film, to releasably engage with a cable holder of a cable connector.

The signal cable may further include a grip unit fixed to one planar side of the cable film.

The grip unit is configured to transfer a force to the cable film, to deform the cable film so that release of the cable locking portion from the cable holder is enabled when external force is applied to the grip unit in a disconnecting direction.

The cable locking portion is engaged with the cable holder by inserting the signal cable into the cable connector in a connecting direction, and the disconnecting direction intersects with the connecting direction.

The grip unit may include a first end fixed to the cable film at an insertion end of the signal cable, and a second end to be gripped, wherein the external force is a pulling force applied to the second end.

The cable locking portion disengages from the cable holder, if the signal cable is inserted into the connector body in a connecting direction and is then pulled in a direction intersecting the connecting direction.

Other aspects of one or more exemplary embodiments may be achieved by providing a cable connector including a connector body; a connector terminal, received by the connector body, to make electrical contact with a cable terminal of a signal cable; and a cable holder, formed in the connector body, to releasably engage with a cable locking portion of the signal cable.

The cable connector may further include a cable guiding portion to guide the cable terminal toward the connector terminal, if the signal cable is inserted into the connector body in a connecting direction.

The cable guiding portion may be provided to at least one lateral side of the connector body to receive a corresponding side portion of the signal cable.

The cable guiding portion may be disposed in opposition to the cable holder to form a cable insertion passage.

The cable holder may further include a guiding surface opposed to the cable guiding portion so as to form a cable insertion passage through which side portions of the signal cable can pass; and a holding surface to engage with the cable locking portion if the signal cable is inserted into the connector body in a connecting direction and to prevent the signal cable from separating in a direction opposed to the connecting direction.

The cable holder may disengage from the cable locking portion, if the signal cable is inserted into the connector body in a connecting direction and is then pulled in a direction intersecting the connecting direction.

Still other aspects of one or more exemplary embodiments may be achieved by providing a signal cable connecting apparatus including a signal cable including a plurality of signal lines, a cable film which sheaths the plurality of signal lines, and a cable locking portion formed in the cable film; and a cable connector including a connector body, a connector terminal, received by the connector body, to make electrical contact with the plurality of signal lines, and a cable holder, formed in the connector body, wherein the cable locking portion and cable holder engage with each other if the signal cable is inserted into the connector body in a connecting direction.

The signal cable may further include a grip unit fixed to one planar side of the cable film.

The grip unit may be formed of a plastic film having one end fixed to the cable film, and another end which is not fixed to the cable film.

The cable locking portion may include at least one of a locking groove and a locking projection, and the cable holder comprises a holding surface to engage with the at least one of the locking groove and the locking projection if the signal cable is inserted into the connector body in a connecting direction.

The cable holder may be disposed within the connector body in opposition to the cable locking portion of the signal cable.

The cable holder may include a number of engagement elements arranged in correspondence to a disposition of corresponding elements of the cable locking portion.

The cable connector may further include a cable guiding portion, provided to at least one lateral side of the connector body to receive a corresponding side portion of the signal cable, to guide the cable terminal toward the connector signal terminal passage.

The cable locking portion and the cable holder can be released from each other if the signal cable is pulled in a direction intersecting the connecting direction.

BRIEF DESCRIPTION OF THE DRAWINGS

The above and/or other aspects will become apparent and more readily appreciated from the following description of exemplary embodiments, taken in conjunction with the accompanying drawings, in which:

FIG. 1 is a schematic perspective view of a signal cable connecting apparatus according to a first exemplary embodiment;

FIG. 4 is a schematic perspective view of a signal cable connecting apparatus according to a second exemplary embodiment; and FIG. 5 is a schematic perspective view of a signal cable connecting apparatus according to a third exemplary embodiment.

DETAILED DESCRIPTION OF EXEMPLARY EMBODIMENTS

Figure 2A:
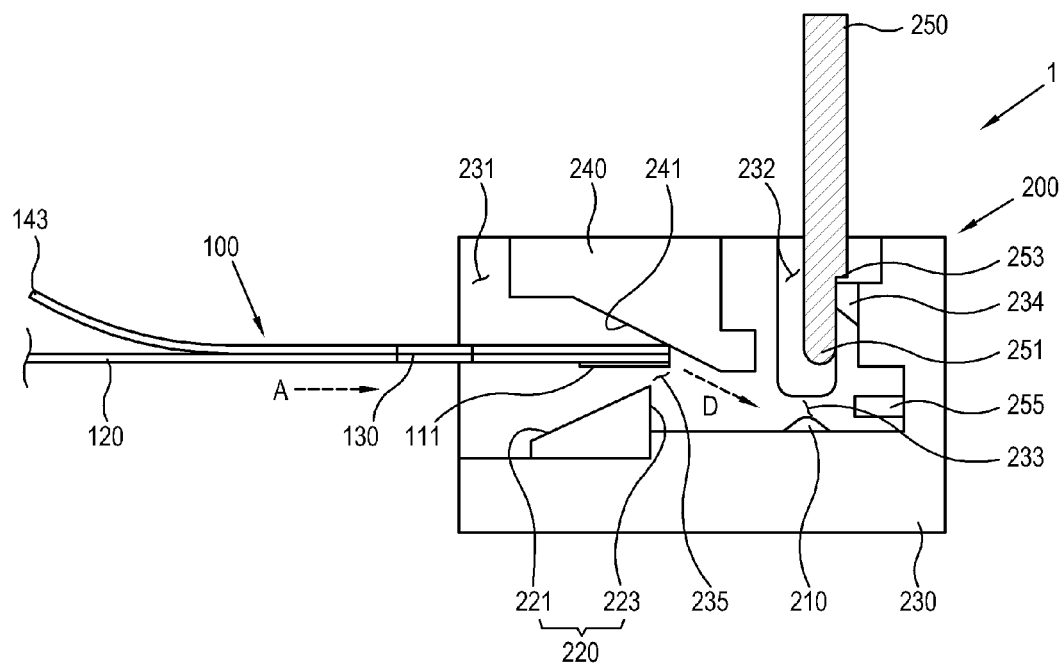
FIGS. 2A-2D are schematic cross-sectional side views sequentially showing a procedure of connecting a signal cable of the signal cable connecting apparatus of FIG. 1 to a cable connector.

Below, a signal cable, a cable connector, and a signal cable connecting apparatus including the same according to exemplary embodiments will be described in detail with reference to accompanying drawings. In describing the exemplary embodiments, like reference numerals refer to like elements throughout, and thus repetitive descriptions thereof will be avoided.

As shown in FIGS. 1, 2A-2D, and 3A-3C, a signal cable connecting apparatus 1 according to a first exemplary embodiment includes a signal cable 100 and a cable connector 200 which is electrically connected to the signal cable 100 and capable of transmitting a signal to the signal cable 100.

FIG. 1 shows one end of the signal cable 100 connecting to one cable connector 200. The other end of the signal cable 100 may be similarly connected. That is, a pair of cable connectors 200 may be provided to connect opposite ends of the signal cable 100.

The cable connector 200, which includes a connector terminal 210, may be mounted to a circuit board (not shown) that receives and/or outputs an electrical signal. The connector terminal 210 may be electrically connected to the circuit board, and as expressed herein, comprises a plurality of electrically conductive contacts.

The signal cable 100 includes a plurality of signal lines 110 connected in parallel; a cable film 120 of an insulating material to sheath the plurality of signal lines 110; and a cable locking portion 130 formed in the cable film 120, to releasably engage with a cable holder 220 of the cable connector 200. That is, the cable locking portion 130 may be locked to or released from the cable holder 220.

The plurality of signal lines 110 is provided to transmit at least one of data, power, and information. For example, the signal cable 100 may be a cable complying with low voltage differential signaling (LVDS) standards. Alternatively, the signal cable 100 may be a signal cable for transmitting a plurality of signals complying with one of various standards. The plurality of signal lines 110 includes a plurality of wiring lines 113, extending the length of the signal cable 100, and a cable terminal 111 for each wiring line 113. Thus, as expressed herein, the cable terminal 111 comprises a plurality of electrically conductive contacts. For convenience, only one of the plural wiring lines 113 is illustrated in the drawings. The cable terminal 111 is an exposed portion (e.g., an end portion) of each wire line 113 and electrically contacts the connector terminal 210 of the cable connector 200, to transmit the data/power/information to the cable connector 200.

The cable film 120 may be provided to wholly sheath the plurality of signal lines 110. Alternatively, the cable film 120 may individually sheath each line of the plural signal lines 110. If the cable film 120 is provided to sheath the individual signal lines 110, the cable film 120 may further include a film covering all or some portion of the individually sheathed signal lines.

The cable locking portion 130 may be provided as a locking groove. Specifically, the locking groove may be formed by inwardly cutting partial sections of left and right edges of the cable film 120. Of course, the shape of the locking groove may be varied depending on the shape of the cable holder 220.

As shown in the drawings, the cable locking portion 130 is provided as a groove formed in the side portion of the signal cable 100, and the cable holder 220 protrudes from the inner surface 231 of the connector body 230. Alternatively, in other exemplary embodiments, the cable locking portion 130 and the cable holder 220 may be provided in various forms, provided that the cable locking portion 130 and the cable holder 220 are configured to engage with and disengage from each other, such that the cable locking portion 130 can be selectively locked to and released from the cable holder 220. For example, the cable locking portion 130 may be provided as a through hole formed in the side portion of the signal cable 100, to receive a corresponding cable holder of the cable connector 200, or as a protrusion formed on the side portion of the signal cable 100, to be received by a corresponding cable holder of the cable connector 200. In any event, the cable holder 220 is disposed in opposition to the position of the cable locking portion 130 and includes engagement elements arranged in correspondence to the disposition of corresponding elements of the cable locking portion 130.

The cable locking portion 130 may penetrate both the cable film 120 and a grip unit 140, as shown in the drawings. In the alternative, a protruding formation of the cable locking portion 130 may be commonly provided on both the cable film 120 and the grip unit 140.

Here, the signal cable 100 may further include the grip unit 140 fixed to one planar side of the cable film 120. The grip unit 140 includes a fixed end 141 coupled with the cable film 120 at an insertion end of the signal cable; and a free end 143, which is not coupled with or fixed to the cable film 120, to enable gripping by a user. The grip unit 140 may be provided as a plastic film made of, for example, polyethylene (PE), polypropylene (PP), or polyethyleneterephthalate (PET). Alternatively, various other synthetic resins may be used for the grip unit 140.

The grip unit 140 is configured to apply a pulling force applied to the signal cable 100 in a direction different from a direction of inserting the signal cable 100 in the cable connector 200. When the grip unit 140 is pulled, the signal cable 100 is moved so that the cable locking portion 130 formed in the signal cable 100 can be released from the cable holder 220 of the cable connector 200.

One or both of the cable film 120 and the grip unit 140 may be made of a plastic material with a predetermined hardness so as to make a connecting sound (a "click") when the cable locking portion 130 is engaged with and locked to the cable holder 220. Therefore, in accordance with whether or not the connecting sound is made, a user can check whether the signal cable 100 is normally connected to the cable connector 200. Accordingly, it can be determined whether the signal cable 100 is connected to the cable connector 200, through the connecting sound only, that is, even under conditions of a narrow or restricted working space for connecting the signal cable 100 with the cable connector 200, when a visual determination is difficult.

Meanwhile, the cable connector 200 includes the connector terminal 210 to electrically contact the terminals of the plural signal lines 110 of the signal cable 100; the cable holder 220 to releasably engage with the cable locking portion 130 when the signal cable 100 is inserted in a connecting direction A; and a connector body 230 to accommodate the connector terminal 210 and the cable holder 220. Thus, with the signal cable 100 in an inserted state, the cable holder 220 holds the signal cable 100 in place.

The connector terminal 210, which is received by the connector body 230, may be mounted to a printed circuit board (not shown) of an electronic device. Thus, the signal cable 100 and the printed circuit board can communicate with each other for data/power/information through the connector terminal 210. Alternatively, the connector terminal 210 may be connected to the printed circuit board via a separate cable.

The connector body 230 has an accommodating space 233 to receive the connector terminal 210 when the cable connector is mounted to a circuit board (not shown). The accommodating space 233 also enables insertion of the signal cable 100 into the connector body 230 and thereby receives the cable terminal 111. With the signal cable 100 thus inserted, the cable terminal 111 and the connector terminal 210 may come into contact with each other within the accommodating space 233.

The cable connector 200 may further include a cable guiding portion 240 to guide the signal cable 100 when the signal cable 100 is inserted into the cable connector 200. More particularly, upon insertion of the signal cable 100 into the connector body 230 of the cable connector 200, the cable guiding portion 240 guides the cable terminal 111 of the signal cable 100 toward the connector terminal 210 in a guiding direction D (FIG. 2A). The cable guiding portion 240 may be provided at one or both lateral sides of the connector body 230 to receive at least one side portion of the signal cable 100, so that the cable guiding portion 240 contacts an upper surface of one or both side portions of the signal cable 100 as the signal cable 100 is guided toward the connector terminal 210. The cable guiding portion 240 may include an inclined surface 241 to guide the signal cable 100 toward the connector signal terminal 210. As the side portions of the signal cable 100 are moved while in contact with the inclined surface 241 of the cable guiding portion 240, the cable terminal 111 moves toward the connector terminal 210.

The cable holder 220, which is formed in the connector body 230, is disposed opposite the cable guiding portion 240 so as to form a cable insertion passage 235 through which the side portions of the signal cable 100 can pass. The cable holder 220 may include a guiding surface 221 formed on a forward side of the cable holder 220 and a holding surface 223 formed on a rearward side of the cable holder 220, so as to extend from an upper point of the guiding surface 221. The holding surface 223 of the cable holder 220 selectively engages with and disengages from the cable locking portion 130 of the signal cable 100, to enable the cable locking portion 130 to be locked to or released from the cable holder 220 according to a manipulation of the grip unit 140. In particular, the holding surface 223 prevents the signal cable 100 from separating from the cable connector 200 in a direction opposed to the connecting direction A.

In this exemplary embodiment, the guiding surface 221 and the holding surface 223 are formed as a single body establishing a lower boundary of the cable insertion passage 235 within the cable holder 220. Alternatively, in another exemplary embodiment, the guiding surface 221 and the holding surface 223 may be provided separately and may form an alternative configuration of the lower boundary of the cable insertion passage 235 within the cable holder 220.

Further in this exemplary embodiment, the cable guiding portion 240 and the cable holder 220 may protrude from an inner surface 231 of the connector body 230, to extend (inwardly) into an interior of the connector body 230. Alternatively, in another exemplary embodiment, one or both of the cable guiding portion 240 and the cable holder 220 may be recessed, in the form of a groove, which will be described later.

The cable connector 200 may further include a pressing member 250 to press the signal cable 100 against the connector terminal 210. In more detail, when the signal cable 100 is inserted into the signal connector 200 such that the cable terminal 111 and the connector terminal 210 are in electrical contact with each other, operation of the pressing member 250 establishes a close (or tight) contact between the cable terminal 111 and the connector terminal 210. With the signal cable 100 thus pressed against the connector terminal 210, the pressing member 250 maintains the close contact between the cable terminal 111 and the connector terminal 210.

The pressing member 250 is rotatably received in a member recess 232 formed in the inner surface 231 of the connector body 230. The pressing member 250 is rotated in order to press the cable terminal 111 against the connector terminal 210. The pressing member 250 can be rotated downward, in a rotating direction E (FIGS. 2B and 2C), to press the cable terminal 111 against the connector terminal 210 and can be rotated upward, in a rotating direction F (FIG. 3A), to allow the signal cable 100 to be released from the cable connector 200. Upward rotation of the pressing member 250 is restricted by a member stopper 234 formed in the connector body 230. The pressing member 250 may be provided with a surface protrusion 253 to be latched on the member stopper 234, by contacting an upper side of the member stopper 234 and thus becoming coupled with the member stopper 234.

In this exemplary embodiment, the pressing member 250 is configured to have a rotatable structure, that is, to enable rotation in the directions E and F. Alternatively, in another exemplary embodiment, the pressing member 250 may be configured to have a piston structure, that is, to move the pressing member 250 up and down without rotation. Specifically, the piston-structured pressing member 250 may include a button (not shown) movable up and down and an elastic member (not shown) elastically biasing the button to a release position. That is, when the button is operated (e.g., pushed downward), the button moves down overcoming the elastic bias of the elastic member and presses the cable terminal 111 against the connector terminal 210; when the button is operated again, the button returns to the release position.

Meanwhile, the connector body 230 of the cable connector 200 includes a signal cable stopper 255 formed on an inner rear wall of the connector body 230, to restrict movement of the signal cable 100 in the connecting direction A. In more detail, as the signal cable 100 is moved in the connecting direction A to become inserted in the cable connector 200, the signal cable stopper 255 limits a moving distance (degree of insertion) of the signal cable 100 along the connecting direction A, to prevent further movement of the signal cable 100 in the connecting direction A and thus prevent an over-insertion condition.

Alternatively, in another exemplary embodiment, the signal cable stopper 255 may be formed on the cable holder 220. Specifically, a stopper surface (not shown) may be extended from the guiding surface 221 of the cable holder 220 and formed in opposition to the holding surface 223. Thus, if the cable locking portion 130 is stopped by the stopper surface, the signal cable 100 is prevented from further movement in the connecting direction A.

Hereinafter, a method of connecting the signal cable 100 to the cable connector 200 will be described with reference to FIGS. 2A-2D.

Figure 2B:
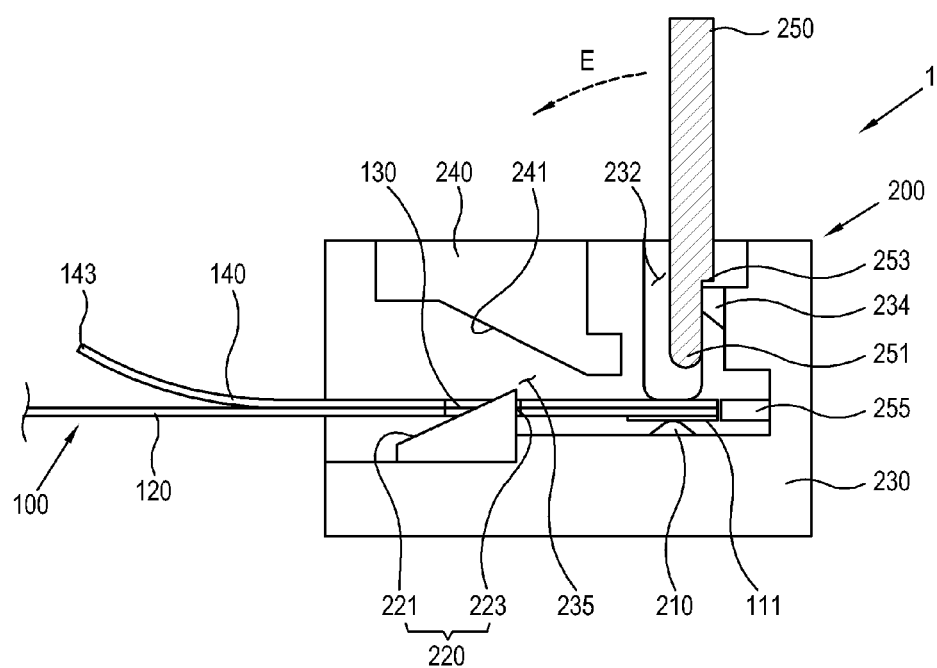

As shown in FIG. 2A, the signal cable 100 is inserted in the cable connector 200 along the connecting direction A. Thus, the insertion end of the signal cable 100 moves toward the connector terminal 210 through the cable insertion passage 235 between the cable guiding portion 240 and the cable holder 220. As the insertion end of the signal cable 100 moves toward the connector terminal 210, the cable locking portion 130 likewise moves along the connecting direction A and becomes engaged with the cable holder 220. As shown in FIG. 2B, the cable locking portion 130 is connected to the cable holder 220, in a locked position.

The holding surface 223 of the cable holder 220 is in contact with a rearward surface of the cable locking portion 130, which surfaces are substantially perpendicular to the connecting direction A. In other words, the holding surface 223 may extend in a direction perpendicular to the connecting direction A. Thus, in the locked position, the signal cable 100 is not easily separated from the cable connector 200 in a direction opposed to the connecting direction A.

Meanwhile, as the signal cable 100 is moved in the connecting direction A, that is, as the signal cable 100 is inserted into the cable connector 200, the insertion end (i.e., at cable terminal 111) of the signal cable 100 is stopped by the signal cable stopper 255. At this time, it is easy to check whether the cable locking portion 130 is connected to the cable holder 220, through the connecting sound made when the cable locking portion 130 becomes engaged with and locked to the cable holder 220.

Figure 2C:
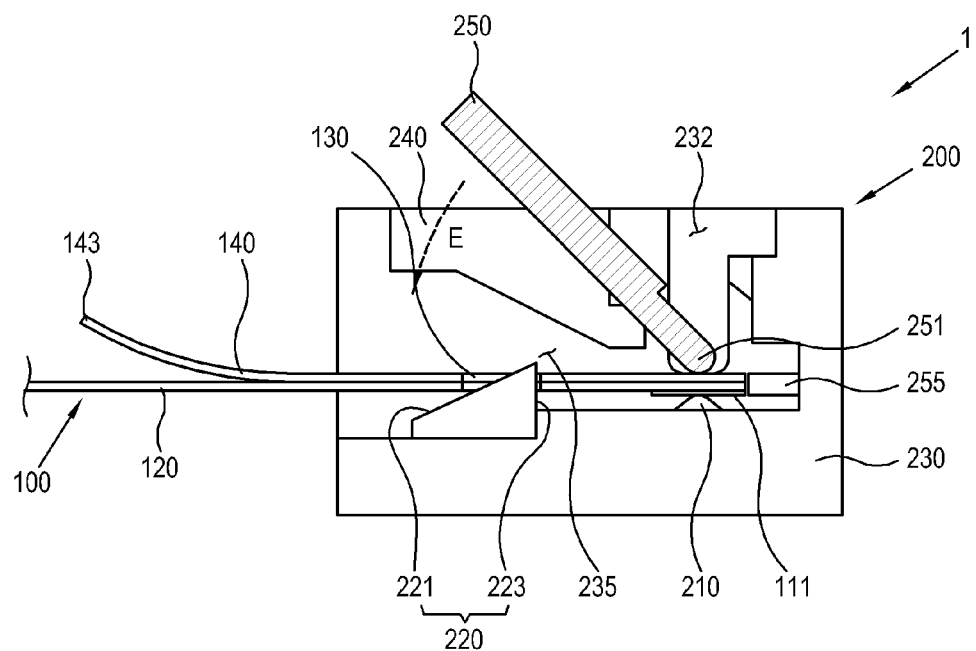
Figure 2D:
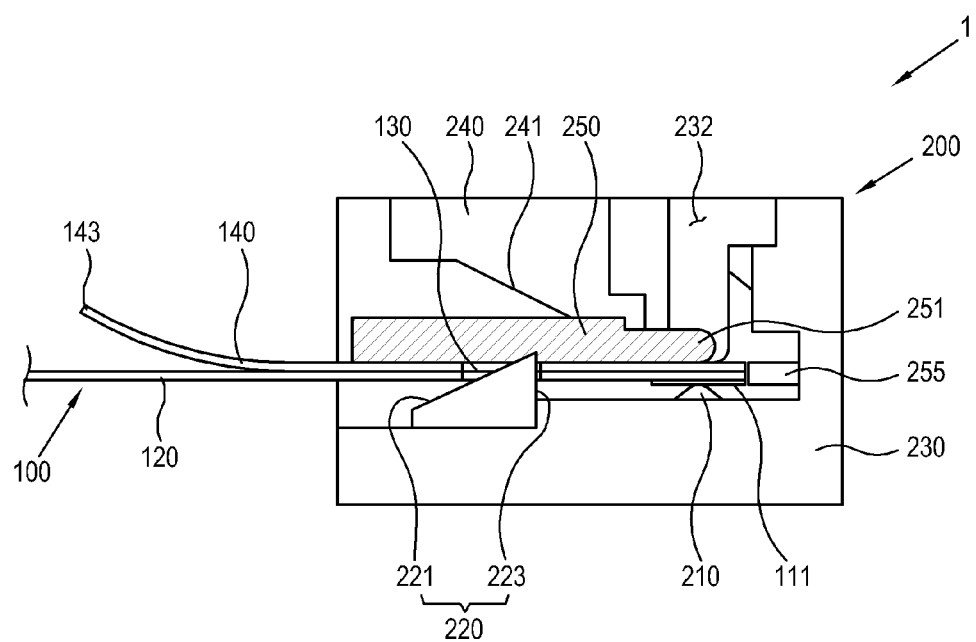

When the cable holder 220 and the cable locking portion 130 are engaged with each other, as shown in any of FIGS. 2B-2D, the cable terminal 111 and the connector terminal 210 are also in contact with each other.

As shown in FIG. 2B, the pressing member 250 is in a latched position with respect to the member stopper 234 of the connector body 230. Then, as the pressing member 250 is rotated (or is otherwise moved) downward, the surface protrusion 253 becomes released from the member stopper 234, as shown in FIG. 2C, and a bottom end 251 of the pressing member 250 moves down to press the cable terminal 111 against the connector signal terminal 210. As shown in FIG. 2D, the pressing member 250 stops moving down when contacting the signal cable 100, in a cable-contacting position.

As described above, if the signal cable 100 is inserted into the cable connector 200 along the connecting direction A, the signal cable 100 and the cable connector 200 are engaged with and locked to each other. Thus, it is possible to prevent the signal cable 100 from separating from the cable connector 200 due to an external shock, the signal cable's own elasticity, or other unexpected external forces.

Figure 3A:
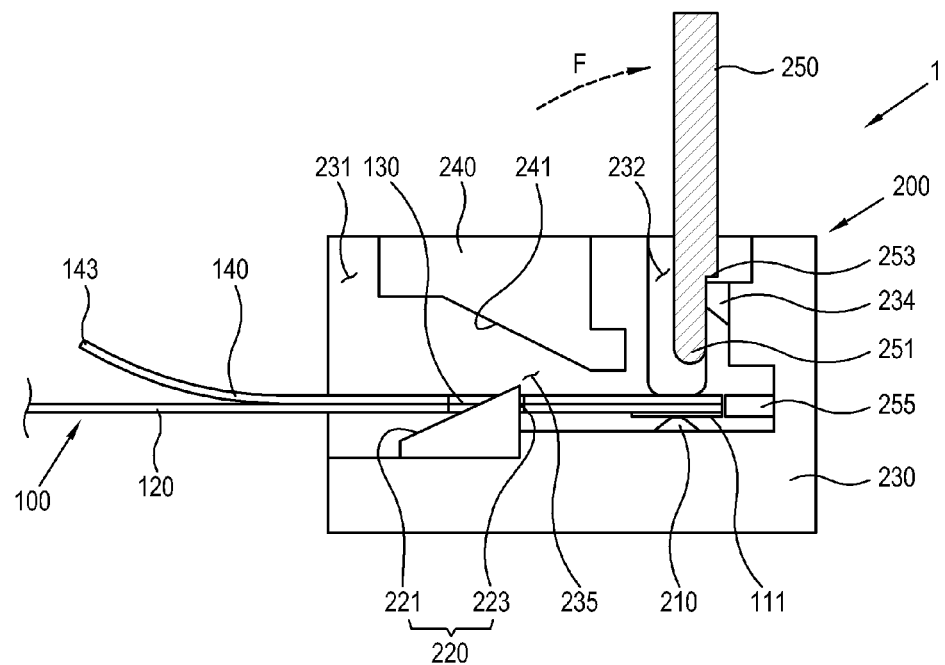
FIGS. 3A-3C are schematic cross-sectional side views sequentially showing a procedure of disconnecting the signal cable of the signal cable connecting apparatus of FIG. 1 from a cable connector.

Hereinafter, a method of disconnecting the signal cable 100 from the cable connector 200 will be described with reference to FIGS. 3A-3C.

With the pressing member 250 in the cable-contacting position as shown in FIG. 2D, the pressing member 250 is rotated (or is otherwise moved) upward. That is, the pressing member 250 is moved in the direction F until the surface protrusion 253 of the pressing member 250 is latched on the upper side of the member stopper 234 and thus coupled with the member stopper 234, as shown in FIG. 3A.

Figure 3B:
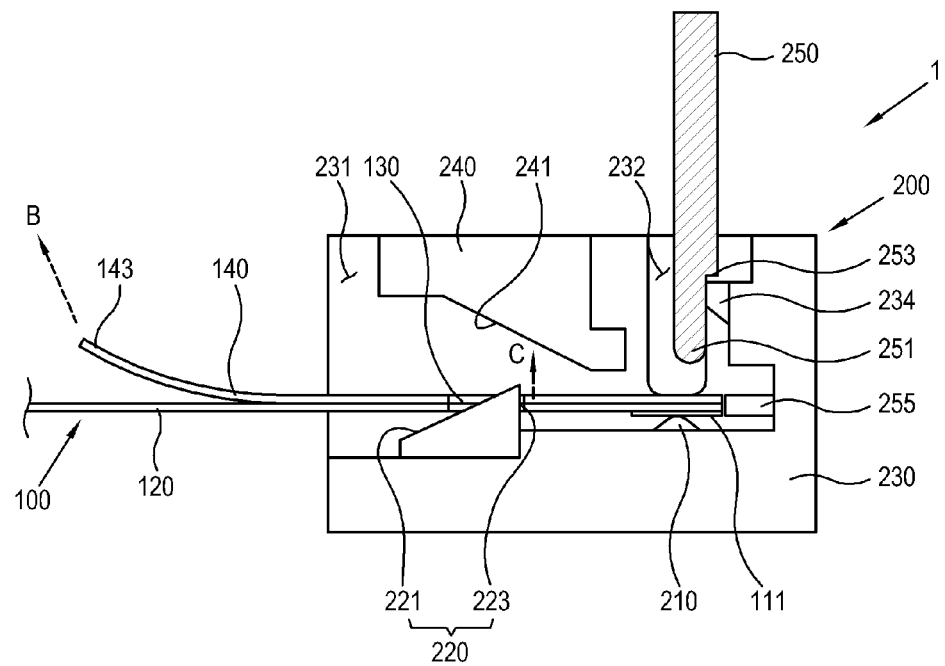

Then, as shown in FIG. 3B, the free end 143 of the grip unit 140 of the signal cable 100 is pulled in a disconnecting direction B. The disconnecting direction B is not a direction parallel to the connecting direction A but a direction intersecting the connecting direction A. When the free end 143 is thus pulled, the cable locking portion 130 formed in the signal cable 100 moves upward with respect to the cable holder 220, by a vertical component C of pulling force in the disconnecting direction B.

Figure 3C:
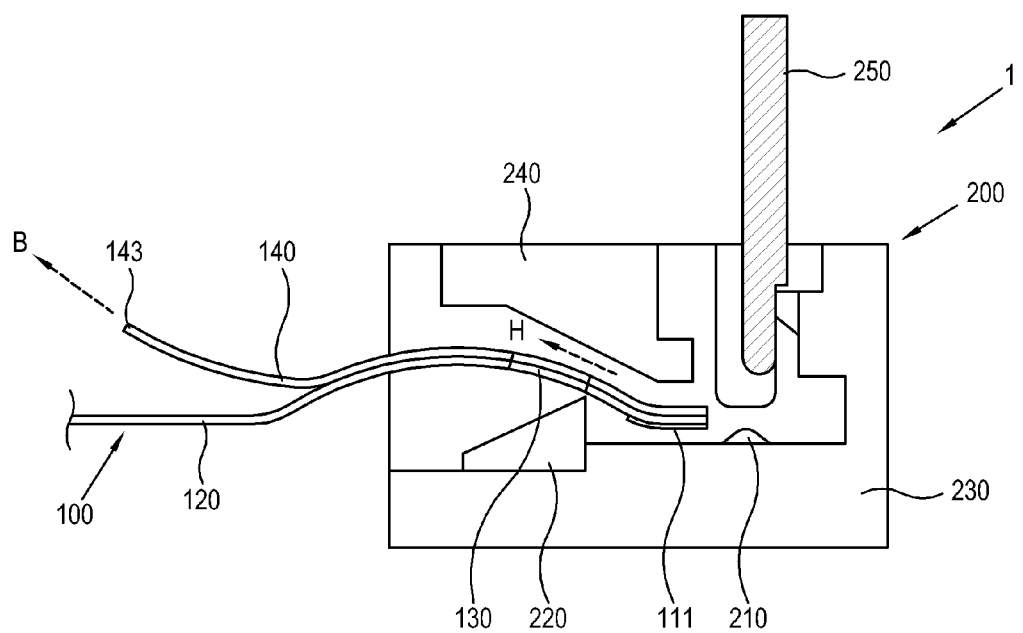

Therefore, as shown in FIG. 3C, the cable locking portion 130 is released from the cable holder 220 so that the signal cable 100 can be disconnected from the cable connector 200. That is, by pulling the grip unit 140 in the disconnecting direction B, a portion of the signal cable 100 near the insertion end is deformed (bowed) upwardly, so that the cable locking portion 130 can be released (separated) from the cable holder 220, allowing the signal cable 100 to be extracted from the cable connector 200 in an extraction direction H.

A signal cable connecting apparatus 1a according to a second exemplary embodiment includes a signal cable 100a and a cable connector 200a, as shown in FIG. 4.

The signal cable 100a and the cable connector 200a of the second exemplary embodiment differ, in terms of the positioning of a cable locking portion 150 and a cable holder 260, from the signal cable 100 and the cable connector 200 of the first exemplary embodiment in which the cable locking portion 130 and the cable holder 220 are disposed at the respective sides of the signal cable 100 and connector body 230. That is, the cable locking portion 150 and the cable holder 260 of the second exemplary embodiment may be substantially centrally disposed on the signal cable 100a and the connector body 230, respectively.

The cable locking portion 150 may be provided as a through hole formed in the signal cable 100a by penetrating a central portion of both the grip unit 140 and the cable film 120. Thus, the cable locking portion 150 is comprised of a single engagement element. Therefore, due to the centrally disposed cable locking portion 150, the signal cable 100a includes a center region G where no signal lines 110 are formed. Meanwhile, in correlation to the center region G, a portion (number) of the individual terminals of the connector terminal 210 may also be omitted in correspondence to the omitted signal lines 110. The number of omitted individual terminals may correspond to a number of omitted individual terminals of the cable terminal 111. Alternatively, contrary to that shown in FIG. 4, the cable locking portion 150 may be provided as a pair of through holes spaced apart from each other laterally across the signal cable 100a, to include two engagement elements. Also, engagement elements of the cable locking portion 150 may vary in number, to include one cable locking portion 150 or a plurality of cable locking portions 150.

The cable holder 260 may be positioned on an upper surface of a bottom portion of the connector body 230, to be disposed in opposition to the position of the cable locking portion 150. The cable holder 260 may include a guiding surface 261 formed on a forward side of the cable holder 260 and a holding surface 263 formed on a rearward side of the cable holder 260, so as to extend from an upper point of the guiding surface 261. The holding surface 263 selectively engages with and disengages from the cable locking portion 130. In particular, the holding surface 263 prevents the signal cable 100a from separating from the cable connector 200 in a direction opposed to the connecting direction A.

As the signal cable 100a is inserted in the cable connector 200a along the connecting direction A, the side portions of the signal cable 100a are guided toward the connector terminal 210 by the cable guiding portion 240. In doing so, the central portion of the signal cable 100a moves along the guiding surface 261 of the cable holder 260. Thus, the cable locking portion 150 becomes engaged with the cable holder 260, in a locked position, and is thus prevented from separating from the cable holder 260 in a direction opposed to the connecting direction A.

As above, in the second exemplary embodiment, the cable locking portion 150 is provided as a through hole, and the cable holder 260 is provided as a protrusion. Alternatively, in another exemplary embodiment, the cable locking portion 150 may be provided as a protrusion (locking projection), and the cable holder 260 may be provided as a through hole or a locking groove.

A signal cable connecting apparatus 1b according to a third exemplary embodiment includes a signal cable 100b and a cable connector 200b, as shown in FIG. 5.

The signal cable 100b and the cable connector 200b of the third exemplary embodiment differ from the signal cable 100 and the cable connector 200 of the first exemplary embodiment in terms of the respective shapes of a cable locking portion 170, a cable guiding portion 270, and a cable holder 280.

The cable locking portion 170 of the signal cable 100b according to the third exemplary embodiment includes locking projections provided on at least one side portion of the signal cable 100b. The locking projection protrudes from one or both edges of the signal cable 100b, that is, in a width direction. Accordingly, after passing through a cable insertion passage formed between the cable guiding portion 270 and the cable holder 280, the locking projection may be selectively engaged with and disengaged from a holding surface 283 of the cable holder 280, to enable the cable locking portion 170 to be locked to or released from the cable holder 280 according to a manipulation of the grip unit 140. In particular, the holding surface 283 prevents the signal cable 100b from separating from the cable connector 200b in a direction opposed to the connecting direction A.

The cable guiding portion 270 and the cable holder 280 of the cable connector 200b may be recessed in the form of a groove on an inner surface 231 of the connector body 230. That is, while the cable guiding portion 240 and the cable holder 220 of the first exemplary embodiment shown in FIG. 1 protrude from the inner surface 231, the cable guiding portion 270 and the cable holder 280 of the third exemplary embodiment are recessed.

The cable guiding portion 270 includes an inclined surface to guide the signal cable 100b, more particularly, the cable terminal 111, toward the connector terminal 210.

The cable holder 280 includes a guiding surface 281 opposed to the cable guiding portion 270 so as to form a cable insertion passage through which the side portions of the insertion end of the signal cable can pass; and a holding surface 283 to engage with the cable locking portion 170, if the signal cable 100b is inserted into the connector body 230 in the connecting direction A, and to prevent the signal cable 100b from separating in a direction opposed to the connecting direction A.

In this third exemplary embodiment, when the grip unit 140 is pulled in the disconnecting direction (refer to "B" of FIG. 3), a portion of the signal cable 100b near the insertion end is deformed (bowed) upwardly, so that the cable locking portion 170 can be released (separated) from the cable holder 280.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. A signal cable, comprising:
   a plurality of signal lines;
   a cable film which sheaths the plurality of signal lines;
   a cable locking portion formed in the cable film, to releasably engage with a cable holder of a cable connector; and
   a grip unit fixed to one planar side of the cable film.

2. The signal cable of claim 1, wherein the grip unit is configured to transfer a force to the cable film, to deform the cable film so that release of the cable locking portion from the cable holder is enabled when external force is applied to the grip unit in a disconnecting direction.

3. The signal cable of claim 2, wherein the cable locking portion is engaged with the cable holder by inserting the signal cable into the cable connector in a connecting direction, and the disconnecting direction intersects with the connecting direction.

4. The signal cable of claim 2, wherein the grip unit comprises:
   a first end fixed to the cable film at an insertion end of the signal cable, and
   a second end to be gripped,
   wherein the external force is a pulling force applied to the second end.

5. The signal cable of claim 1, wherein the cable locking portion disengages from the cable holder, if the signal cable is inserted into the connector body in a connecting direction and is then pulled in a direction intersecting the connecting direction.

6. A cable connector, comprising:
   a connector body;
   a connector terminal, received by the connector body, to make electrical contact with a cable terminal of a signal cable;
   a cable holder, formed in the connector body, to releasably engage with a cable locking portion of the signal cable, wherein the cable holder includes an inclined surface, which inclines upwardly along an insertion direction of the signal cable into the connector body; and
   a cable guiding portion, formed in the connector body, which includes an inclined surface, which inclines downwardly along the insertion direction of the signal cable into the connector body, to guide the cable terminal toward the connector terminal,
   wherein, when a signal cable is inserted into the connector terminal, the inclined surface of the cable holder and the inclined surface of the cable guiding portion face opposite surfaces of an insertion end of the signal cable.

7. The cable connector of claim 6, wherein the cable guiding portion is provided to at least one lateral side of the connector body to receive a corresponding side portion of the signal cable.

8. The cable connector of claim 6, wherein the inclined surface of the cable guiding portion is disposed in direct opposition to the inclined surface of the cable holder to form a cable insertion passage therebetween.

9. The cable connector of claim 6, wherein the cable holder comprises:
   a holding surface formed on a rearward side of the cable holder, to engage with the cable locking portion if the signal cable is inserted into the connector body and to prevent the signal cable from separating in a direction opposed to the insertion direction.

10. The cable connector of claim 6, wherein the cable holder disengages from the cable locking portion, if the signal cable is inserted into the connector body in a connecting direction and is then pulled in a direction intersecting the connecting direction.

11. A signal cable connecting apparatus, comprising:
a signal cable comprising
   a plurality of signal lines,
   a cable film which sheaths the plurality of signal lines,
   a grip unit fixed to one planar side of the cable film, and
   a cable locking portion formed in the cable film; and
a cable connector comprising
   a connector body,
   a connector terminal, received by the connector body, to make electrical contact with the plurality of signal lines, and
   a cable holder, formed in the connector body,
wherein the cable locking portion and cable holder engage with each other if the signal cable is inserted into the connector body in a connecting direction.

12. The signal cable connecting apparatus of claim 11, wherein the grip unit is formed of a plastic film having one end fixed to the cable film, and another end which is not fixed to the cable film.

13. The signal cable connecting apparatus of claim 11, wherein the cable locking portion comprises at least one of a locking groove and a locking projection, and the cable holder comprises a holding surface to engage with the at least one of the locking groove and the locking projection if the signal cable is inserted into the connector body in a connecting direction.

14. The signal cable connecting apparatus of claim 11, wherein the cable holder is disposed within the connector body in opposition to the cable locking portion of the signal cable.

15. The signal cable connecting apparatus of claim 11, wherein the cable holder comprises a number of engagement elements arranged in correspondence to a disposition of corresponding elements of the cable locking portion.

16. The signal cable connecting apparatus of claim 11, wherein the cable connector further comprises a cable guiding portion, provided to at least one lateral side of the connector body to receive a corresponding side portion of the signal cable, to guide the cable terminal toward the connector signal terminal passage.

17. The signal cable connecting apparatus of claim 11, wherein the cable locking portion and the cable holder can be released from each other if the signal cable is pulled in a direction intersecting the connecting direction.

* * * * *